(12) United States Patent
Blaetter et al.

(10) Patent No.: US 6,631,041 B1
(45) Date of Patent: Oct. 7, 2003

(54) APPARATUS TO STEER A COLLIMATED LASER BEAM

(75) Inventors: Torsten J. Blaetter, Oakdale, MN (US); Scott C. Milton, Maplewood, MN (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/162,479

(22) Filed: Jun. 4, 2002

(51) Int. Cl.[7] .......................... G02B 7/02; G02B 27/10; G02B 27/30
(52) U.S. Cl. ................. 359/822; 359/618; 359/641
(58) Field of Search .................. 359/811, 819, 359/820, 821, 822, 823, 830, 618, 641

Primary Examiner—Hung Xuan Dang
Assistant Examiner—Joseph Martinez
(74) Attorney, Agent, or Firm—William F. Noval

(57) ABSTRACT

A laser imaging system comprising: a laser diode which projects a laser beam along a first, optical axes; a collimation lens positioned along the first, optical axis for collimating the laser beam; and an assembly for mounting the laser diode and the collimation lens for selective rotation about the first, optical axis and for rotation about second and third mutually perpendicular axes which are also perpendicular to the first, optical axis in order to effect rotation of the laser beam about the first, second and third axes.

13 Claims, 5 Drawing Sheets

APPARATUS TO STEER A COLLIMATED LASER BEAM

FIELD OF THE INVENTION

This invention relates in general to laser imaging systems and more particularly to a laser diode imaging system having improved laser beam alignment in the optics module.

BACKGROUND OF THE INVENTION

Laser imaging systems are commonly used in scanning and printing applications. In one scanning application, an unmodulated laser beam from a laser scans an image on film or hard copy to produce a raster image which is detected and further utilized. In another scanning application, a storage phosphor storing a latent x-ray image is scanned to produce an emitted x-ray image which is detected and further utilized. In a printing application the laser beam is modulated with image information to expose photosensitive media such as film, paper, electrophotographic media or the like.

In laser imaging systems, it is very important for a laser imager that the laser beam is well-defined in shape, direction and collimation. There are various solutions to this problem which use mirrors and/or prisms to give the laser beam the correct direction. One of the problems with achieving alignment, if a semiconductor laser source is used, is that the Z-axis locations (parallel to the optical axis) of the collimating lens relative to the laser diode has to be held constant at all times while the pair is moved around in the X-Y plane (perpendicular to the optical axis). Some applications require an additional glass plate or lens to control the laser diode output via feedback to a detector device. This requires an even more accurate steering of the laser beam directly after collimation is achieved.

Current art has the laser diode mounted permanently to the laser driver board. This causes problems when an adjustment needs to be made to the alignment of the laser beam. The laser diode then needs to be unsoldered from the board, repositioned, and then remounted to the driver board. This series of steps is not only time consuming but poses significant static and heat risks to the laser diode and the driver board. A second problem is that the manufacturing tolerances of the lens, laser diode, and current mounting system are too loose. Because of this, lateral alignment is very difficult to achieve.

SUMMARY OF THE INVENTION

According to the present invention, there is provided a solution to these problems.

According to a feature of the present invention, there is provided a laser diode which projects a laser beam along a first optical axis;

a collimation lens positioned along said first optical axis for collimating said laser beam; and an assembly for mounting said laser diode and said collimation lens for selective rotation about said first, optical axis and for rotation about second and third mutually perpendicular axes which are also perpendicular to said first, optical axis in order to effect rotation of said laser beam about said first, second and third axes.

ADVANTAGEOUS EFFECT OF THE INVENTION

The invention has the following advantages.
1. The biggest advantage is that the risk of heat and static damage caused by re-soldering a laser diode during an alignment process is reduced to a minimum.
2. In addition, the assembly and adjustment time is significantly reduced.
3. The collimating lens can be adjusted perpendicular to its optical axis.

DETAILED DESCRIPTION OF THE INVENTION

Figure 1:
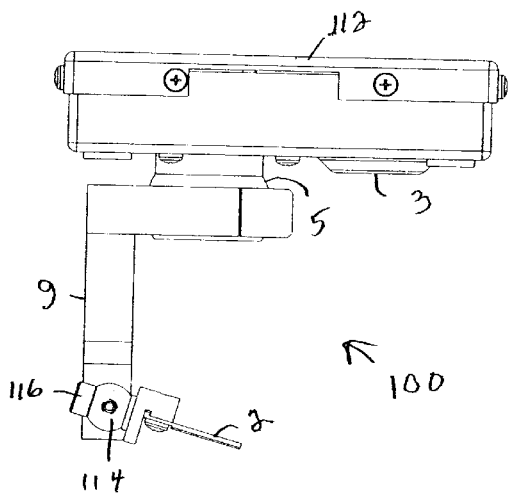
FIG. 1 is a top plan view of the first embodiment of FIG. 10 in nominal position.
Figure 2:
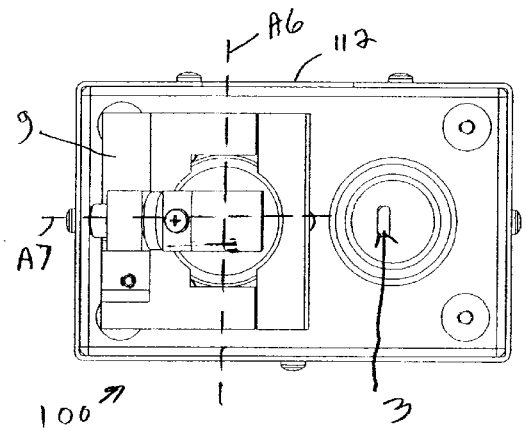
FIG. 2 is a front elevational view of the first embodiment of FIG. 10 in nominal position.
Figure 3:
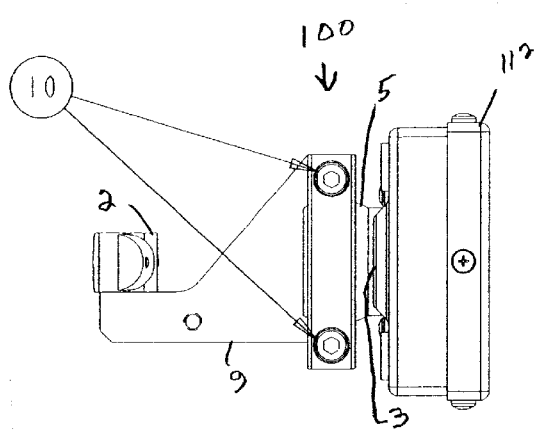
FIG. 3 is a side elevational view of the first embodiment of FIG. 10 in nominal position.
Figure 4:
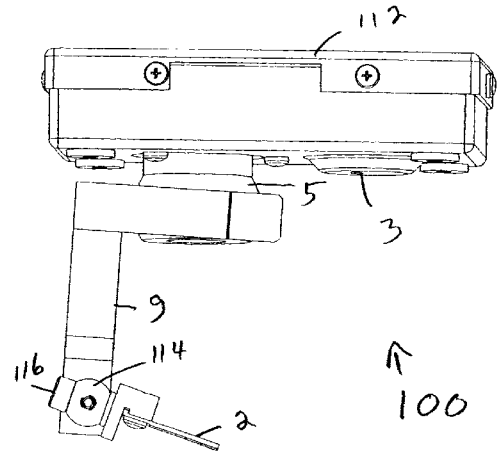
FIG. 4 is a top plan view of the first embodiment of FIG. 10 in an arbitrary adjusting position of the laser collimation mount.
Figure 5:
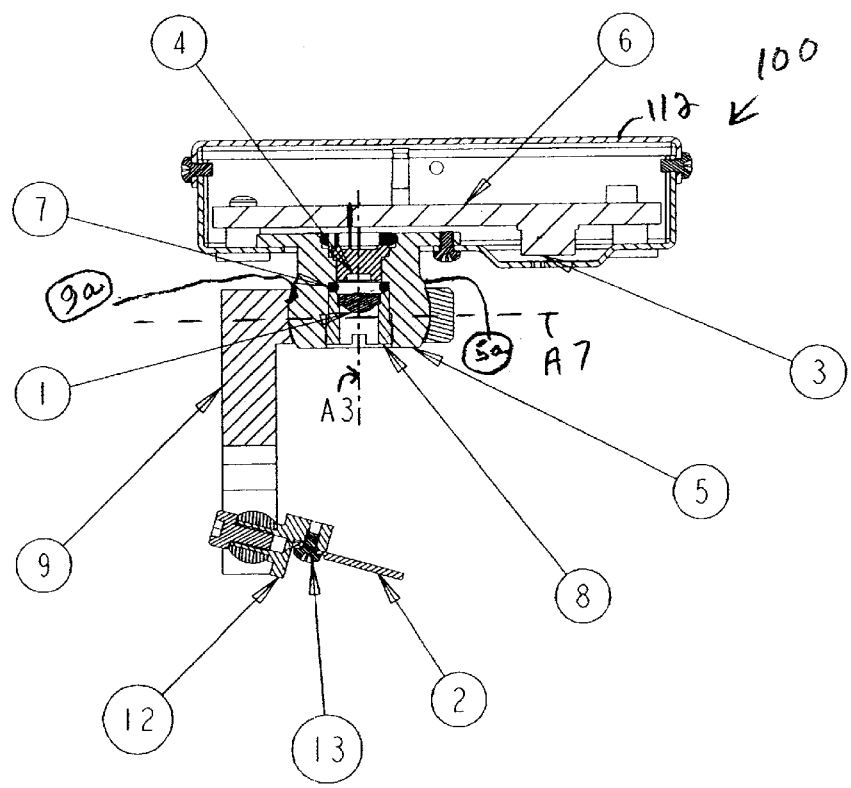
FIG. 5 is a sectional top view of the first embodiment of FIG. 10 showing the location of the internal and external parts.

Referring now to FIGS. 10, 1–7, there is shown a first embodiment of the invention. As shown, a laser imaging system (100) includes a first housing (112) having mounted therein a laser driver board (6) having soldered thereto laser diode (4). Feedback photodiode (3) is also mounted on board (6). Collimation tube (5) is mounted on housing (112) and contains laser diode (4), collimation lens (1), collimation lens mount (8), and spring or O-ring (7). Collimation tube (5) has a spherical portion (5a) which mounts in spherical bearing (9a) of fixedly supported L-shaped mount (9) and is secured by screws (10) (FIG. 3) to mount (9). Lens (2) is mounted on the end of mount (9) by vertical bearing (114) and horizontal bearing (116). Collimation tube (5) and housing (112) are rotatable around axes A3, A6 and A7 to allow the laser be to be rotated about these axes while the laser diode (4) is fixed to board (6).

A feature of the invention is to allow a laser beam originating from a laser diode to be collimated and directed along the optical path of a given design utilizing a laser diode source. First the collimating lens (1) is adjusted along its optical axis to achieve the desired level of collimation. Then a reflecting lens (2) directs a portion of the beam towards a photo diode (3) to create a feedback loop for modulation of the laser diode (4).

The first embodiment of the invention operates as follows:

The laser diode (4) is mounted in the collimation tube (5) and soldered onto the laser driver board (6). A spring or O-ring (7) creates a constant pressure against the collimation lens mount (8) and the collimation lens (1) to remove thread backlash between items (1) and (8). The lens (1) position is adjusted along the optical axis (A3) by rotating its mount (8). The mount (8) is then rotated to bring the lens (1) into a rough collimation prior to any adjustment of the beam direction.

The collimation tube (5) is then rotated in the concave spherical mount (9) about axes A3, A6 and A7 to direct the laser beam along its appropriate path and fixated by slightly tightening two screws (10). The lens (2) should be now positioned to approximately the final position. The laser beam (120) coming out of the collimation tube (5) (and the assembly attached to it) is properly aimed through the lens (2) towards a target. The collimation tube (5) is then locked in position by tightening either one of the two screws (10) on the spherical mount (9).

Figure 6:
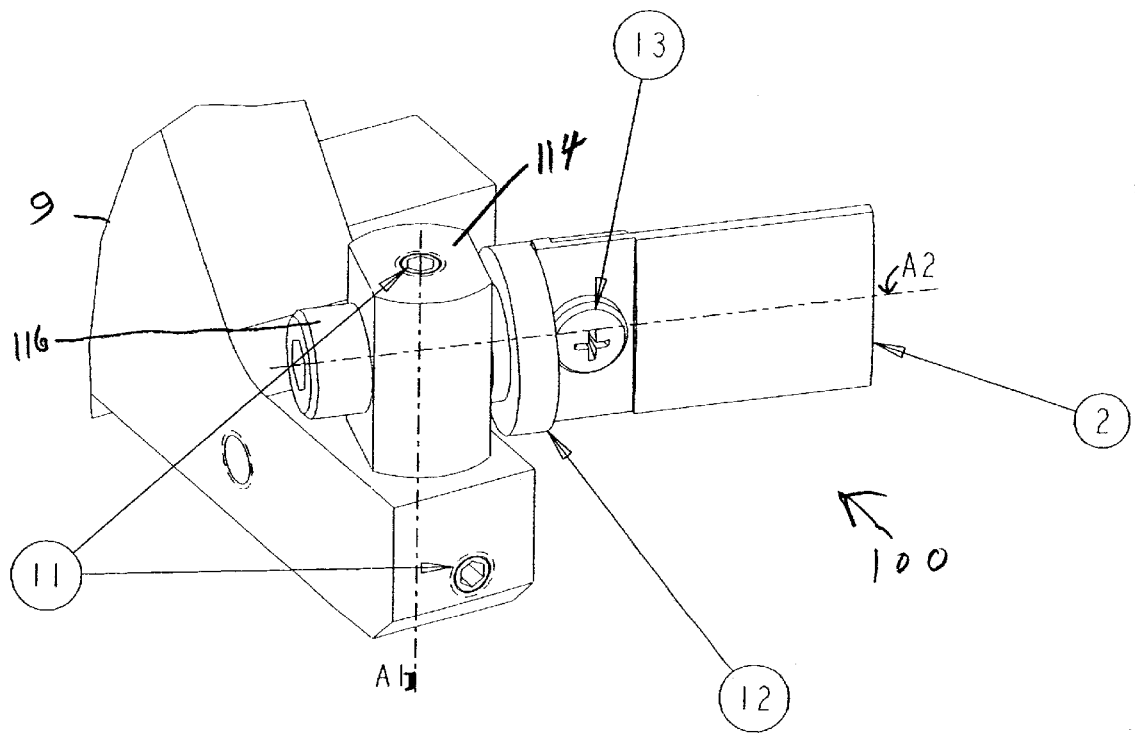
FIG. 6 is a close-up partial perspective view to show the adjusting mechanism of the feedback lens of the first embodiment of FIG. 10.
Figure 7:
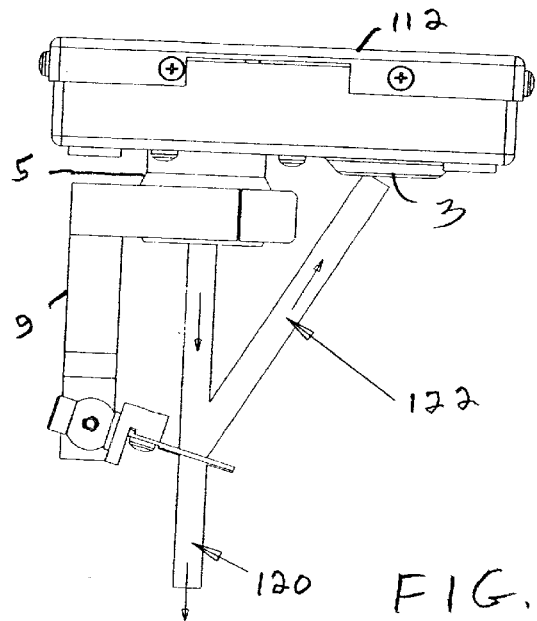
FIG. 7 is a top plan view of the first embodiment of FIG. 10 showing the beam path of the device.

Once the laser beam has been successfully aimed, the feedback lens (2) has to be adjusted to its final position. This is accomplished by rotating lens (2) around two axes (A1 and A2) until the reflected laser beam (122) hits the desired position on the photo diode (3). The rotational position of the feedback lens (2) is secured with set screws (11) (FIG. 6). The power output of the laser diode (4) can now be adjusted by electronic means. The final position of the feedback lens (2) is adjusted by translating it along axis (A2). The feedback lens-L1 (2) is then locked into position on its mount (12) by tightening screw (13). The translation adjustment is unneeded if a flat glass plate is used instead of a lens (2).

Figure 8:
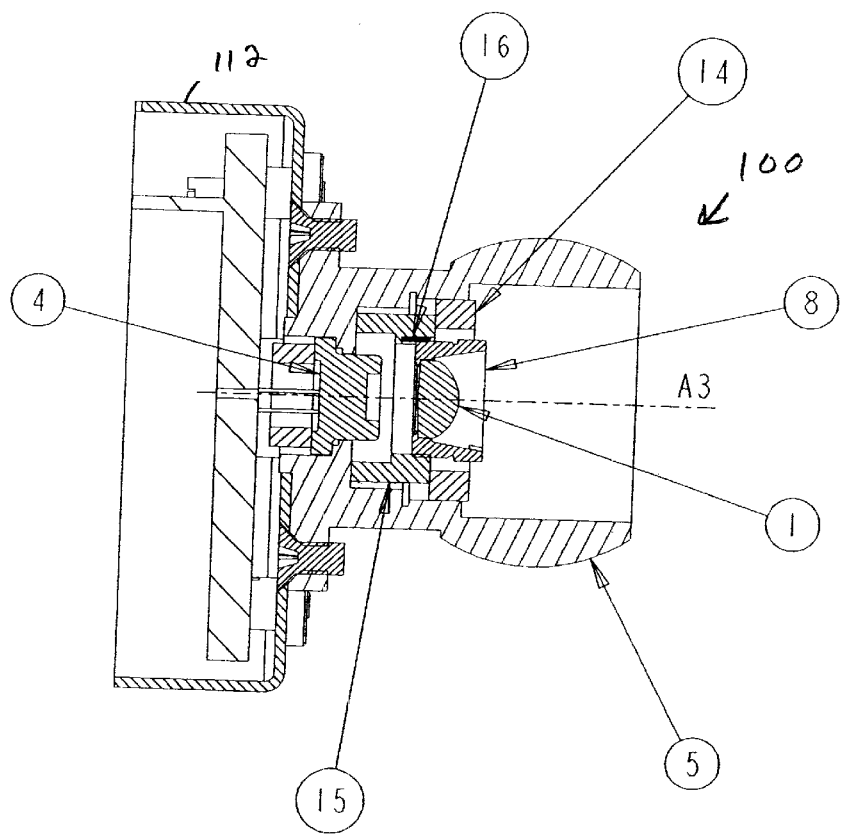
FIG. 8 is a sectional side elevational view of a second embodiment of the invention showing the location of the internal parts along the optical axis.
Figure 9:
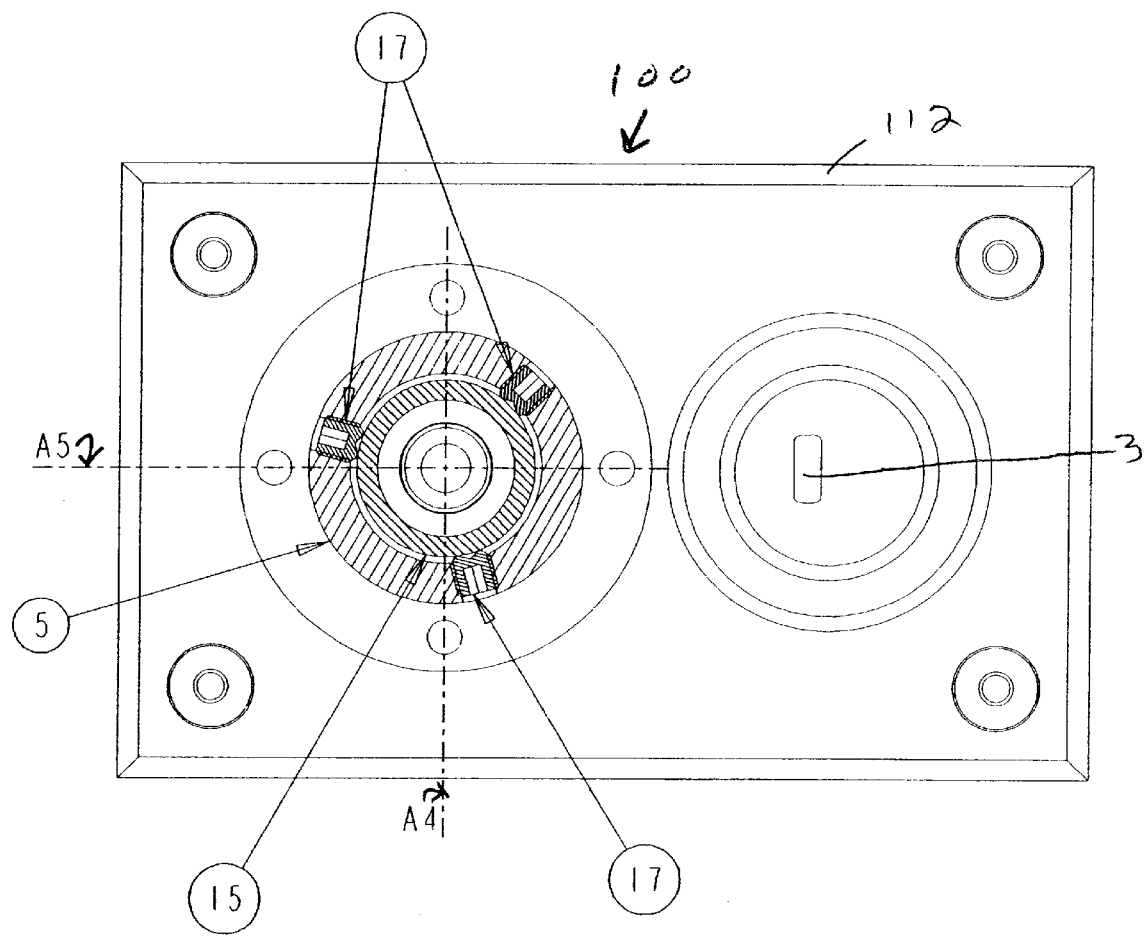
FIG. 9 is a sectional front elevational view of the second embodiment of the invention showing the lateral adjustment features.
Figure 10:
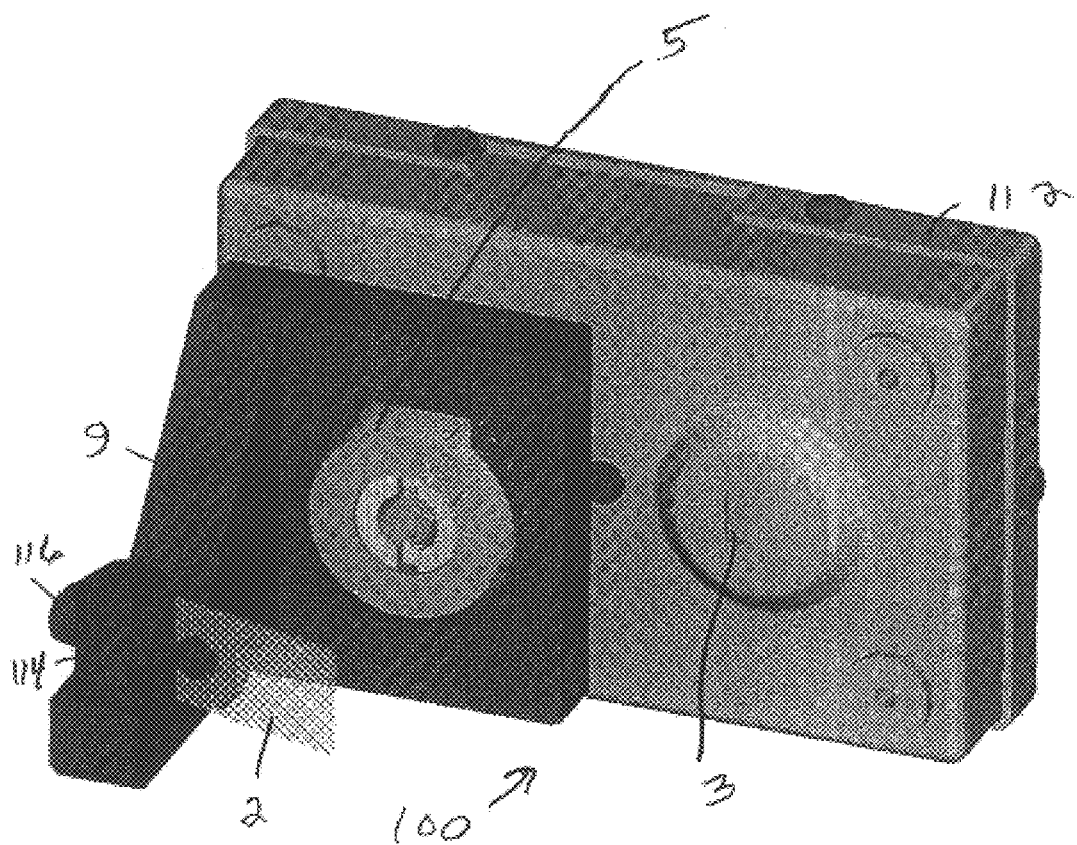
FIG. 10 is a perspective view of a first embodiment of the present invention.

Referring now to FIGS. 8 and 9 there is shown a second embodiment of the invention. This embodiment includes features that allow for the lateral adjustment of the collimating lens (1). For this case, the lens mount (8) is threaded into a secondary lens mount (15). To avoid extensive thread backlash, an insert (16), made out of a soft material, is used while the lens mount (8) is rotated during focus adjustment. The secondary mount is held in position by a hold down ring (14) and three screws (17). During the alignment process, the hold down ring (14) constraints the front surface of the secondary lens mount (15) so it is free to move laterally in the A4–A5 plane, but movement along the optical axis (A3) is blocked. By tightening and/or loosening of the three screws (17) in series, the secondary lens mount (15) and collimating lens (1) are adjusted perpendicular to the optical axis (A3) until the best focus position is found. Once the final location is set, the hold down ring (14) is tightened.

The invention has been described in detail with particular reference to certain preferred embodiments thereof, but it will be understood that variations and modifications can be effected within the spirit and scope of the invention.

PARTS LIST 1 lens-collimating
2 lens-L1 or plate glass
3 diode photo
4 diode laser
5 mount spherical collimation
5a spherical portion
6 assembly PC board, laser driver
7 O-ring
8 mount-lens collimating
9 mount-clamping sphere
9a spherical bearing
10 screw
11 screw
12 mount-lens-L1
13 screw
14 ring hold down
15 mount-lens, secondary
16 insert
17 screw
100 laser imaging system
112 housing
114 vertical bearing
116 horizontal bearing
120 laser beam
122 reflected laser beam

What is claimed is:

1. A laser imaging system comprising:

a laser diode which projects a laser beam along a first, optical axis;

a collimation lens positioned along said first, optical axis for collimating said laser beam; and an assembly for mounting said laser diode and said collimation lens for selective rotation about said first, optical axis and for rotation about second and third mutually perpendicular axes which are also perpendicular to said first, optical axis in order to effect rotation of said laser beam about said first, second and third axes.

2. The laser imaging system of claim 1 wherein said assembly mounts said collimation lens for movement in opposite directions along said first, optical axis.

3. The laser imaging system of claim 2 wherein said assembly includes a first member mounting said collimation lens and a second member into which said first member is threaded so that rotation of said first member relative to said second member moves said collimation lens along said first, optical axis.

4. The laser imaging system of claim 3 including a backlash member exerting a constant pressure on said first member to remove thread backlash between said first and second members.

5. The laser imaging system of claim 4 wherein said backlash member is one of a spring or an O-ring.

6. The laser imaging system of claim 3 including a third member having a cylindrical bore within which said second member is coaxially mounted; and further including an alignment assembly mounted by said third member and coupled to said second member for moving said second member in a plane perpendicular to said first, optical axis.

7. The laser imaging system of claim 6 wherein said alignment assembly includes a set of screws threaded through said third member into contact with said second member, said screws being individually rotatable to move said second member in said plane.

8. The laser imaging system of claim 7 wherein said set of screws includes at least three screws, mounted circumferentially about said third member at angular distances of 120 degrees from each other.

9. The laser imaging system of claim 1 wherein said assembly mounts said collimation lens for movement in a plane perpendicular to said first, optical axis.

10. The laser imaging system of claim 9 wherein said assembly further mounts said collimation lens for movement in opposite directions along said first, optical axis.

11. The laser imaging system of claim 1 including a laser beam feedback lens positioned along said first, optical axis spaced from said collimation lens, said feedback lens directing a portion of said laser beam to a photodetector, and including a feedback lens mount for mounting said feedback lens for rotation about mutually perpendicular axes and for translation along one of said mutually perpendicular axes.

12. The laser imaging system of claim 11 including a photodetector positioned proximal to said photodiode and mounted by said assembly.

13. A laser imaging system comprising:

a laser diode which projects a laser beam along an optical axis;

a collimation lens for collimating said laser beam;

a collimation lens mount for mounting said collimation lens for movement in opposite directions along said optical axis;

a laser beam feedback lens; and a feedback lens mount for mounting said feedback lens along said optical axis spaced from said collimation lens, said feedback lens directing a portion of said laser beam to a photo-detector, wherein said feedback lens mount mounts said feedback lens for rotation about first and second mutually perpendicular axes and for translation along one of said first and second axes.

* * * * *